United States Patent [19]

Pachonik

[11] 4,448,652

[45] May 15, 1984

[54] DEVICE FOR THE CATHODE SPUTTERING OF A METAL

[75] Inventor: Horst Pachonik, Taufkirchen, Fed. Rep. of Germany

[73] Assignee: Siemens Aktiengesellschaft, Berlin and Munich, Fed. Rep. of Germany

[21] Appl. No.: 431,552

[22] Filed: Sep. 30, 1982

[30] Foreign Application Priority Data

Dec. 7, 1981 [DE] Fed. Rep. of Germany ....... 3148354

[51] Int. Cl.$^3$ ............................................. C23C 15/00
[52] U.S. Cl. ................................. 204/298; 204/192 R
[58] Field of Search ........................... 204/298, 192 R

[56] References Cited

U.S. PATENT DOCUMENTS

| 3,977,955 | 8/1976 | Nevis et al. | 204/298 |
| 4,209,375 | 6/1980 | Gates et al. | 204/298 |
| 4,272,355 | 6/1981 | Kennedy | 204/192 R |
| 4,282,924 | 8/1981 | Faretra | 204/298 |
| 4,290,876 | 9/1981 | Nishiyama et al. | 204/298 |
| 4,341,816 | 7/1982 | Lauterbach et al. | 204/192 R |

FOREIGN PATENT DOCUMENTS 7235665 7/1972 Japan .

OTHER PUBLICATIONS

Vossen et al. Thin Film Processes; Academic Press; N.Y.; N.Y.; 1978, pp. 30, 31, 37-39.
Esdonk et al. Vacuum Technology Research Development, Jan. 1975, pp. 41-44.

Primary Examiner—Arthur P. Demers
Attorney, Agent, or Firm—Herbert L. Lerner; Laurence A. Greenberg

[57] ABSTRACT

Device for cathode sputtering of metal, comprising a holder, means for cooling the holder, a heat conducting paste layer disposed on the holder, and a target bolted to the holder with the heat conducting paste layer disposed therebetween as a heat transfer medium, the target being formed of the metal to be sputtered. The heat conducting layer may also be metal powder or foil.

10 Claims, 1 Drawing Figure

U.S. Patent
May 15, 1984
4,448,652
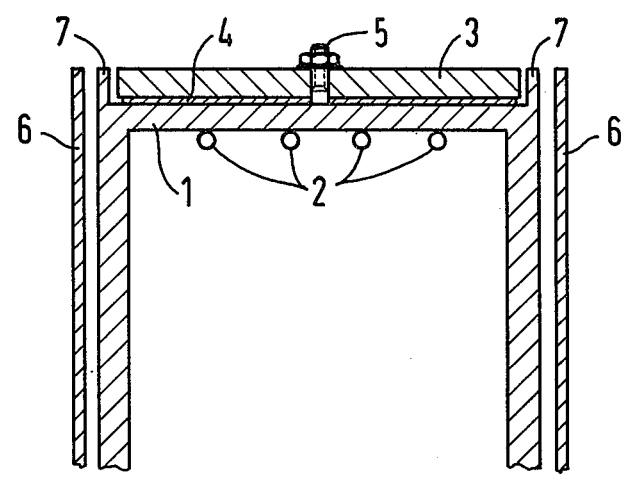

DEVICE FOR THE CATHODE SPUTTERING OF A METAL

The invention relates to a device for the cathode sputtering of a metal, in which a target formed of the metal to be sputtered is connected to a holder, with an intermediate joining of a heat conducting layer, and wherein the mounting is provided with a cooling installation.

In such apparatus for cathode sputtering, the material is the "target", which is connected to the potential of the cathode, and is sputtered by bombardment with inert gas ions. This process is carried out in a vacuum with pressures of about $10^{-2}$ to $10^{-4}$ mbar. While the flow of current can be a few amperes, considerable energy is converted, which has to be carried off over the target. Because of this, good heat contact between the target and the target holder as well as a cooling installation, in general a water cooling system, is necessary for the holder.

Heretofore, good heat contact has been accomplished through the target being soldered or bonded onto the target mounting with a low melting alloy. With a good bonding, there is generally a maximum of 60 percent of the target area in heat conducting connection with the mounting or holder.

During high efficiency sputtering, the amount of sputtering material is so high that with continuous operation, the target is used up after a few days. In the known devices, a target change is associated with a large time and cost outlay. For this reason, sputtering for many metal lining processes have not been used, although it would be desirable.

It is accordingly an object of the invention to provide a device for cathode sputtering of a metal, which overcomes the hereinaforementioned disadvantages of the heretofore-known devices of this general type, wherein the target can be simply and quickly connected to the mounting or holder and wherein a good heat transfer between the target and mounting is guaranteed.

With the foregoing and other objects in view, there is provided, in accordance with the invention, a device for cathode sputtering of metal, comprising a holder, means for cooling said holder, a heat conducting paste layer disposed on the holder, and a target bolted to the holder with the heat conducting paste layer disposed or joined therebetween as a heat transfer medium, the target being formed of the metal to be sputtered.

In accordance with the another feature of the invention, the heat conducting paste layer contains thermically difficult to decompose organic and/or silicon compounds.

In accordance with a further feature of the invention, there is provided a holder, means for cooling the holder, a heat conducting metal powder layer joined or disposed on the holder, and a target bolted to the holder with the heat conducting metal powder layer disposed therebetween as a heat transfer medium, the target being formed of the metal to be sputtered.

In accordance with an added feature of the invention, the metal powder layer includes a metal from the group consisting of copper, aluminum, bronze and brass.

In accordance with an additional feature of the invention, the range of grain sizes of the metal powder is at least as large as 5 μm.

In accordance with again another feature of the invention, there is provided a holder, means for cooling the holder, a heat conducting metal foil layer disposed on the holder, and a target bolted to the holder with the heat conducting metal foil layer joined or disposed therebetween as a heat transfer medium, the target being formed of the metal to be sputtered.

In accordance with again a further feature of the invention, the metal foil is doubled in place and is welded together at edges thereof, and including a gas-free heat conductive paste contained inside the doubled foil.

In accordance with again an added feature of the invention, the metal foil is substantially 50 μm thick and is formed of a metal from the group consisting of copper and a copper alloy.

In accordance with a concomitant feature of the invention, the holder has a rim integral therewith.

The device according to the invention is advantageously provided in such a manner that on one hand the target is screwed, easily loosened and joined with the holder and that furthermore, a good heat transfer between the target and the mounting or holder exists.

Other features which are considered as characteristic for the invention are set forth in the appended claims.

Although the invention is illustrated and described herein as embodied in a device for the cathode sputtering of a metal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawing which is a fragmentary, diagrammatic, cross-sectional view of a device according to the invention.

Referring now to the single FIGURE of the drawing in detail, there is seen a holder or mounting 1 having a cooling installation on the lower surface thereof, which includes pipes 2 through which water flows. A target 3 is seen in the drawing, which has an intermediate joining of a heat conducting layer 4, and is connected through a screw 5 with the holder 1. Through the heat conducted layer 4 between the target 3 and holder 1, a sufficient heat transfer is assured, so that the sputtering installation can be operated at full capacity.

An embodiment according to the invention is constructed in such a way that the heating conducting layer 4 is formed of a heat conducting paste, which contains organic or silicon compounds.

In this case, it must nevertheless be certain, that only cooled zones are spread with the paste, since otherwise the danger exists of the steam traces of the cooling medium entering the sputter space.

In another embodiment, the heat conducting layer is in the form of a metal powder, in which preferably copper, aluminum, bronze or brass is used. Advantageously, the granulation of the metal powder is equal to or larger than 5 μm, to avoid a smearing and dustflight, which can lead to short circuits between the cathode (the target 3 is connected with the potential of the cathode) and dark space screening 6. With equal distribution of the metal powder, the heat transfer from the target 3 to the holder 1 is just as good as with soldered, brazed or bonded-on targets.

In another embodiment, the heat conducting layer is formed of a metal foil, which prefereably is doubled in place, and is welded on the edges. Before the welding is completed, the tube or hose which is formed by the metal foil, is filled in with a small amount of a gas-free heat conducting paste, so that a very thin pad of any desired form (for example, with notches for the screw which passes through) is formed. This pad is adjusted in such a way that it is flush with its surface to the mounting and to the target, and forms a bridge over its contents with good heat conductivity. On the other hand, the metal foils have to be so thin that they still conform adequately to the surface, but simultaneously resist the surface pressure of target 3, without bursting. Advantageously, copper or copper alloys used, therefore have a thickness of approximately 50 $\mu$m, because of easy welding and ductility.

It is possible through the simple screw technique to place a rim 7 on the mounting, the rim 7 being as high or somewhat higher than the target 3. This rim 7 can be finish ground, so that no electrical arc over or breakdown from the edge of the target 3 to the dark space screening 6 takes place because of the increased field intensity on craters or peaks. The rim 7 guarantees an especially simple insertion of the heat conduction layer 4.

Consequently, the way in which the embodiments are constructed according to the invention is such that an apparatus for cathode sputtering is created, in which a target can be connected in an especially simple way with the mounting, so that good heat transfer between the target and the mounting is guaranteed.

The foregoing is a description corresponding to German Application No. P 31 48 354.2, dated Dec. 7, 1981, the International priority of which is being claimed for the instant application and which is hereby made part of the application. Any discrepancies between the foregoing specification and the aforementioned corresponding German application are to be resolved in favor of the latter.

I claim:

1. Device for cathode sputtering of metal, comprising a holder, means for cooling said holder, a heat conducting paste layer disposed on said holder, a target disposed on said heat conducting paste layer, and a bolt connecting said target to said holder with said heat conducting paste layer disposed therebetween as a heat transfer medium, said target being formed of the metal to be sputtered.

2. Device according to claim 1, wherein said heat conducting paste layer contains thermically difficult to decompose organic compounds.

3. Device according to claim 1, wherein said heat conducting paste layer contains thermically difficult to decompose silicon compounds.

4. Device for cathode sputtering of metal, comprising a holder, means for cooling said holder, a heat conducting metal powder layer disposed on said holder, a target disposed on said heat conducting metal powder layer, and a bolt connecting said target to said holder with said heat conducting metal powder layer disposed therebetween as a heat transfer medium, said target being formed of the metal to be sputtered.

5. Device according to claim 3, wherein said metal powder layer includes a metal from the group consisting of copper, aluminum, bronze and brass.

6. Device according to claim 4 or 5, wherein the range of grain sizes of said metal powder is at least as large as 5 $\mu$m.

7. Device for cathode sputtering of metal, comprising a holder, means for cooling said holder, a heat conducting metal foil layer disposed on said holder, a target disposed on said heat conducting metal foil layer, and a bolt connecting said target to said holder with said heat conducting metal foil layer disposed therebetween as a heat transfer medium, said target being formed of the metal to be sputtered.

8. Device according to claim 7, wherein said metal foil is doubled in place and is welded together at edges thereof, and including a gas-free heat conductive paste contained inside said doubled foil.

9. Device according to claim 7 or 8, wherein said metal foil is substantially 50 $\mu$m thick and is formed of a metal from the group consisting of copper and a copper alloy.

10. Device according to claim 1, 4 or 7, wherein said holder has a rim integral therewith.

* * * * *